(12) United States Patent
Fuchs et al.

(10) Patent No.: US 8,665,417 B2
(45) Date of Patent: Mar. 4, 2014

(54) APPARATUS AND METHOD FOR INSPECTING A SUBSTRATE

(75) Inventors: Andreas Fuchs, Meerbusch (DE); Maurits Van Der Schaar, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 325 days.

(21) Appl. No.: 12/996,211

(22) PCT Filed: Jun. 4, 2009

(86) PCT No.: PCT/EP2009/056844
§ 371 (c)(1),
(2), (4) Date: Jun. 15, 2011

(87) PCT Pub. No.: WO2009/150089
PCT Pub. Date: Dec. 17, 2009

(65) Prior Publication Data
US 2011/0255066 A1    Oct. 20, 2011

Related U.S. Application Data

(60) Provisional application No. 61/060,759, filed on Jun. 11, 2008.

(51) Int. Cl.
*G03B 27/42* (2006.01)
*G03B 27/52* (2006.01)
*G03B 27/32* (2006.01)
*G03B 27/54* (2006.01)
*G03B 27/58* (2006.01)

(52) U.S. Cl.
USPC ................... 355/53; 355/27; 355/67; 355/72; 355/77

(58) Field of Classification Search
USPC ............ 355/27, 53, 66–71, 72, 75, 77; 430/5, 430/22, 30, 296, 311, 312, 321, 325; 356/399–401, 490, 508, 515, 521, 614, 356/615, 620, 625
See application file for complete search history.

(56) References Cited

U.S. PATENT DOCUMENTS 5,017,514 A * 5/1991 Nishimoto ...................... 438/14
6,330,355 B1 * 12/2001 Chen et al. ..................... 382/151

(Continued)

FOREIGN PATENT DOCUMENTS

EP    1 628 164 A2    2/2006
EP    1 903 397 A2    3/2008

OTHER PUBLICATIONS

International Preliminary Report on Patentability directed to related International Application No. PCT/EP2009/056844, mailed on Dec. 23, 2010, The International Bureau of WIPO, Geneva, Switzerland; 2 pages.

(Continued)

*Primary Examiner* — Toan Ton
*Assistant Examiner* — Christina Riddle
(74) *Attorney, Agent, or Firm* — Sterne, Kessler, Goldstein & Fox P.L.L.C

(57) ABSTRACT

An apparatus measures properties, such as overlay error, of a substrate divided into a plurality of fields. The apparatus includes a radiation source configured to direct radiation onto a first target of each field of the substrate. Each first target (T4G) has at least a first grating and a second grating having respective predetermined offsets, the predetermined offset (+d) of the first grating being in a direction opposite the predetermined offset (−d) of the second grating. A detector is configured to detect the radiation reflected from each first target and to obtain an asymmetry value for each first target from the detected radiation. Further, a module is configured to determine an overlay value for each first target based on at least the obtained asymmetry value and the predetermined offsets and determine a polynomial fit across a plurality of first targets of a corresponding plurality of fields of the substrate for a relationship between the obtained asymmetry value and determined overlay value of each first target.

22 Claims, 9 Drawing Sheets

(56) References Cited

U.S. PATENT DOCUMENTS

| | | | |
|---|---|---|---|
| 6,928,628 B2 * | 8/2005 | Seligson et al. | 382/151 |
| 6,982,793 B1 * | 1/2006 | Yang et al. | 356/401 |
| 7,170,604 B2 * | 1/2007 | Sezginer et al. | 356/400 |
| 2002/0158193 A1 | 10/2002 | Sezginer et al. | |
| 2004/0066517 A1 * | 4/2004 | Huang et al. | 356/509 |
| 2004/0129900 A1 * | 7/2004 | Den Boef et al. | 250/559.3 |
| 2004/0169861 A1 * | 9/2004 | Mieher et al. | 356/400 |
| 2006/0074611 A1 * | 4/2006 | Wong et al. | 703/2 |
| 2007/0229837 A1 * | 10/2007 | Schaar et al. | 356/456 |
| 2007/0291269 A1 * | 12/2007 | Van Der Schaar et al. | 356/401 |
| 2008/0043239 A1 | 2/2008 | Boef et al. | |
| 2008/0074666 A1 * | 3/2008 | Boef et al. | 356/400 |

OTHER PUBLICATIONS

Written Opinion of the International Searching Authority directed to related International Application No. PCT/EP2009/056844, European Patent Office, Rijswijk, Netherlands, mailed on Dec. 23, 2010; 8 pages.

* cited by examiner

APPARATUS AND METHOD FOR INSPECTING A SUBSTRATE

CROSS-REFERENCE TO RELATED APPLICATIONS

This application claims the benefit of U.S. provisional application 61/060,759, which was filed on Jun. 11, 2008, and which is incorporated herein in its entirety by reference.

FIELD

The present invention relates inspection apparatus and inspection techniques for use in lithographic apparatus and in methods of manufacture involving lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti parallel to this direction. It is also possible to transfer the pattern from the patterning device to the substrate by imprinting the pattern onto the substrate.

In order to monitor the lithographic process, it is often necessary to measure parameters of a patterned substrate, such as an overlay error between successive layers formed in or on the substrate. Various techniques exist for making measurements of microscopic structures formed on substrates by lithographic processes, including the use of scanning electron microscopes and various specialized tools. In particular, one form of specialized inspection tool is a scatterometer, which directs a beam of radiation onto a target on the surface of the substrate and measured properties of the scattered or reflected beam. By comparing the properties of the beam before and after it has been reflected (or scattered) by the substrate, the properties of the substrate can be determined. For example, the properties of the reflected beam can be compared with data stored in a library of known measurements associated with known substrate properties.

In general, there are two classes of scatterometers: spectroscopic scatterometers and angularly-resolved scatterometers. Spectroscopic scatterometers direct a broadband radiation beam onto a substrate and measure a spectrum (i.e., intensity as a function of wavelength) of the radiation scattered into a particular narrow angular range. Angularly-resolved scatterometers use a monochromatic radiation beam and measure the intensity of the scattered radiation as a function of angle.

As mentioned above, it is important to ensure that successive layers of products that are printed onto the substrate are aligned with each other. For example, if a single layer of an IC were misaligned, or were to have an overlay error, one portion of the IC could be electrically connected to a different portion of the IC, thus creating an electrical contact that was neither intended nor desired.

Specialized overlay targets are often used to measure overlay and thus, determine whether there are overlay errors on the substrate. These specialized overlay targets are generally printed in non-product areas of the substrate (e.g., areas not containing structures that will eventually be part of the IC or other product). Such non-product areas include scribe lanes, which exist between fields of a substrate and which will be sawn to separate the products once the substrate is fully exposed.

Overlay targets generally include gratings that are made up of arrays of printed bars. Such gratings affect radiation that is reflected from them in predictable ways and variations in the reflected radiation are relatively simple to observe. Overlay targets are generally are printed on a substrate in layers in a manner similar to as the printing of other substrate features. A relative position of one layer of a grating with respect to a successive layer of the same grating is measurable using a scatterometer, as described above.

Overlay errors are rarely constant over an entire substrate and may vary from field to field. In order to monitor this variation, each field is generally associated with several overlay targets. Existing overlay measuring systems often required several targets per field (e.g., four to six targets per field). As there are generally of the order of 100 fields per substrate, the substrate may include several hundred overlay targets that must be printed and measured, thereby consuming time, space and resources.

Further, existing techniques for measuring overlay error generally assume that a simple, linear relationship exists between the overlay and an asymmetry measured by a scatterometer (e.g., a measured difference between the two gratings). Such techniques leverage the assumed linear relationship to reduce both the number of targets within each field of the substrate and the number of overlay measurements made within each target. It is desirable to have as few targets as possible so that valuable "real estate" is not used up, particularly in the scribe lanes of the substrate. The real estate is valuable because there are several different types of targets (or marks) that are desired to be put into the scribe lanes, but the scribe lanes are also preferably made as small as possible so that as little as possible of the substrate surface is wasted (i.e., the surface is not used for the product which can eventually be sold).

The assumption of a linear relationship is valid to a certain extent, e.g., as long as the asymmetry and overlay values are both very close to zero, as depicted in FIG. 11. This is because the relationship of asymmetry with overlay is in fact generally accepted to be sinusoidal and as such, the linear relationship will only work for overlay numbers of less than about a quarter of the pitch (p) of the grating in each direction. However, the assumption of the linear relationship is not accurate for larger overlay errors, nor is it particularly accurate even for small overlay errors, as the curve of the sinusoidal relationship is not taken into account.

SUMMARY

Therefore, what is needed is a method and apparatus that measures properties of a substrate, such as overlay and asymmetry, using as few targets as possible and without assumptions on the relationship between the measured properties, thereby substantially obviating the drawbacks of the conventional systems.

In an embodiment, there is provided an apparatus for measuring properties of a substrate. The apparatus includes a radiation source configured to direct radiation onto targets of corresponding fields of the substrate, wherein a first one of the targets has at least a first grating and a second grating having respective predetermined offsets, the predetermined offset of the first grating being in a direction opposite the predetermined offset of the second grating. A detector is configured to detect the radiation reflected from the first one of the targets and to obtain an asymmetry value for the first one of the targets from the detected radiation. A controller is configured to (i) determine an overlay value for the first one of the targets based on at least the obtained asymmetry value and the predetermined offsets and (ii) determine a polynomial fit across the targets for a relationship between the obtained asymmetry value and the determined overlay value of the targets.

In a further embodiment, there is provided a substrate having at least two targets associated with each field of the substrate. A first one of the targets has at least a first grating and a second grating having respective predetermined offsets, the predetermined offset of the first grating being in an direction opposite the predetermined offset of the second grating. A second one of the targets has at least a first grating.

In a further embodiment, there is provided a measuring properties of a substrate. Targets are printed onto corresponding fields of the substrate. A first one of the targets has at least a first grating and a second grating having respective predetermined offsets, the predetermined offset of the first grating being in an direction opposite the predetermined offset of the second grating, and a second one of the targets has at least a first grating. A radiation beam is reflected from the first one of the targets of corresponding fields of the substrate. The reflected radiation beam from the first one of the targets is detected to obtain an asymmetry value for the first one of the targets. An overlay value is determined for the first one of the targets based on at least the obtained asymmetry value and the predetermined offsets. A polynomial fit is determined across the targets for the relationship between the obtained asymmetry value and the determined overlay value of the targets.

In a further embodiment, there is provided a lithographic apparatus having an illumination optical system arranged to illuminate a pattern on a patterning device, a projection optical system arranged to project an image of the pattern onto a substrate having multiple fields, and an apparatus for measuring properties of a substrate. The apparatus includes a radiation source configured to direct radiation onto targets of corresponding fields of the substrate, wherein a first one of the targets has at least a first grating and a second grating having respective predetermined offsets, the predetermined offset of the first grating being in a direction opposite the predetermined offset of the second grating. A detector is configured to detect the radiation reflected from the first one of the targets and to obtain an asymmetry value for the first one of the targets from the detected radiation. A controller is configured to (i) determine an overlay value for the first one of the targets based on at least the obtained asymmetry value and the predetermined offsets and (ii) determine a polynomial fit across the targets for a relationship between the obtained asymmetry value and the determined overlay value of the targets.

In a further embodiment, there is provided a lithographic cell having a coater configured to coat a substrate with a radiation sensitive layer, a lithographic apparatus configured to expose images onto the radiation sensitive layer of the substrate coated by the coater, a developer configured to develop images exposed by the lithographic apparatus, and an apparatus for measuring properties of a substrate. The apparatus includes a radiation source configured to direct radiation onto targets of corresponding fields of the substrate, wherein a first one of the targets has at least a first grating and a second grating having respective predetermined offsets, the predetermined offset of the first grating being in a direction opposite the predetermined offset of the second grating. A detector is configured to detect the radiation reflected from the first one of the targets and to obtain an asymmetry value for the first one of the targets from the detected radiation. A controller is configured to (i) determine an overlay value for the first one of the targets based on at least the obtained asymmetry value and the predetermined offsets and (ii) determine a polynomial fit across the targets for a relationship between the obtained asymmetry value and the determined overlay value of the targets.

In a further embodiment, there is provided a device manufacturing method that forms a pattern on a substrate and that determining a value related to a parameter of the formed pattern. In the determination step, targets are printed onto corresponding fields of the substrate. A first one of the targets has at least a first grating and a second grating having respective predetermined offsets, the predetermined offset of the first grating being in an direction opposite the predetermined offset of the second grating, and a second one of the targets has at least a first grating. The determination step also includes reflecting a radiation beam from the first one of the targets of corresponding fields of the substrate. The reflected radiation beam from the first one of the targets is detected to obtain an asymmetry value for the first one of the targets. An overlay value is determined for the first one of the targets based on at least the obtained asymmetry value and the predetermined offsets. A polynomial fit is determined across the targets for the relationship between the obtained asymmetry value and the determined overlay value of the targets.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 1A and 1B schematically depicts a lithographic apparatus, according to an embodiment of the present invention.

FIG. 2 schematically depicts a lithographic cell or cluster, according to an embodiment of the present invention.

FIGS. 3 and 4 illustrate features of a scatterometer, according to embodiments of the present invention.

FIG. 5 schematically depicts a substrate subdivided into fields, according to an embodiment of the present invention.

FIGS. 6A, 6B, and 6C depict an exemplary method for measuring a property of a substrate subdivided into a plurality of fields, according to an embodiment of the present invention.

One or more embodiments of the present invention will now be described with reference to the accompanying drawings. In the drawings, like reference numbers can indicate identical or functionally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1A:
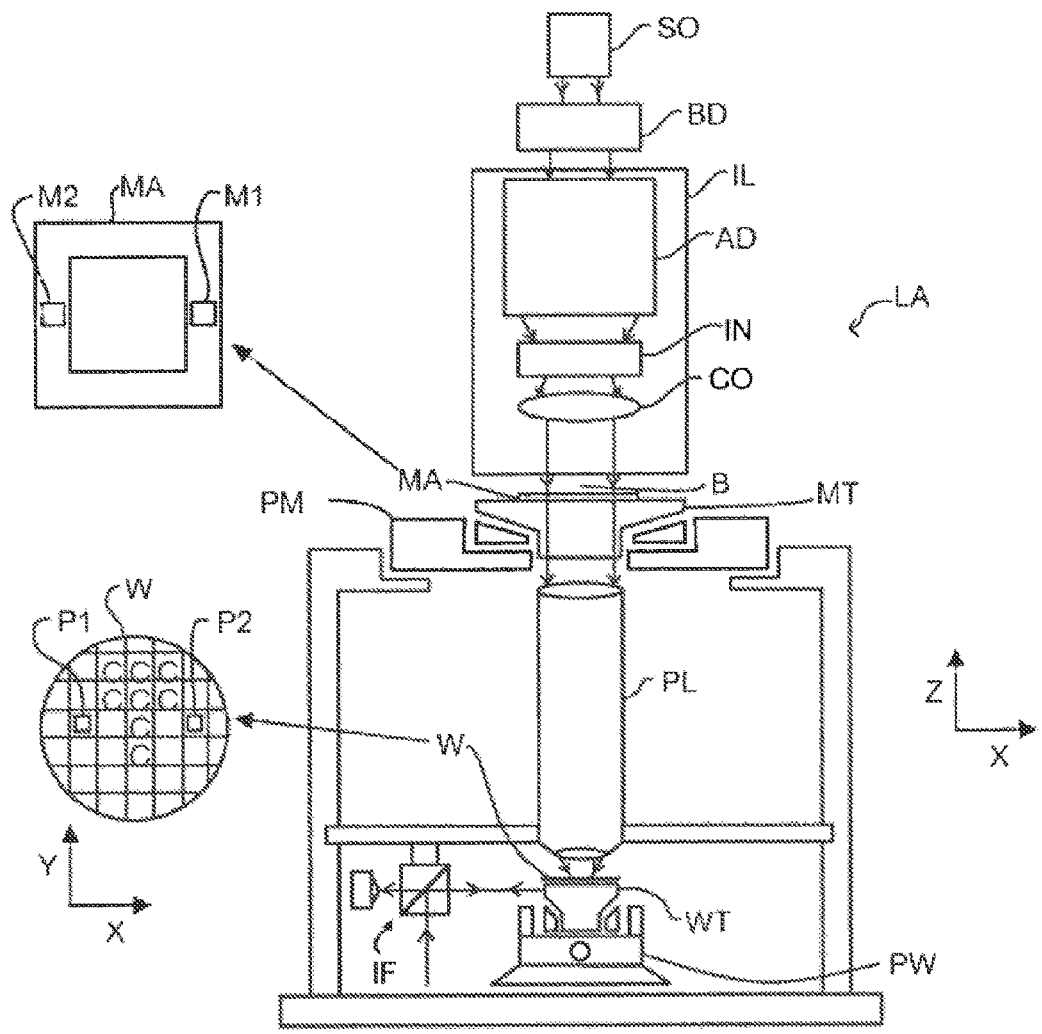

FIG. 1A schematically depicts a lithographic apparatus 1 according to one embodiment of the invention. The apparatus 1 includes an illumination system (illuminator) IL configured to condition a radiation beam B (e.g., UV radiation or EUV radiation). A support MT (e.g., a mask table) is configured to support a patterning device MA (e.g., a mask) and is connected to a first positioner PM that accurately positions the patterning device in accordance with certain parameters. A substrate table WT (e.g., a wafer table) is configured to hold a substrate W (e.g., a resist-coated wafer) and is connected to a second positioner PW that accurately positions the substrate in accordance with certain parameters. A projection system PS (e.g., a refractive projection lens system) is configured to project a pattern imparted to the radiation beam B by patterning device MA onto a target portion C (e.g., comprising one or more dies) of the substrate W.

The illumination system may comprise various types of optical components, including, but not limited to, refractive, reflective, magnetic, electromagnetic, electrostatic or other types of optical components, or any combination thereof, to direct, shape, or control radiation.

Support MT bears the weight of the patterning device. Further, support MT holds the patterning device in a manner that depends on the orientation of the patterning device, the design of the lithographic apparatus, and other conditions, such as, for example, whether or not the patterning device is held in a vacuum environment. Support MT can use mechanical, vacuum, electrostatic or other clamping techniques to hold the patterning device. Support MT can be a frame or a table, for example, which may be fixed or movable as required. Support MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern comprises phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include, but are not limited to, masks, programmable mirror arrays, and programmable LCD panels. Masks, also called reticles, are well known in lithography, and include binary, alternating phase-shift, and attenuated phase-shift masks, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including, but not limited to, refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As herein depicted, apparatus 1 is of a reflective type (e.g., employing a reflective mask). Alternatively, apparatus 1 may be of a transmissive type (e.g., employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate is covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1A, the illuminator IL receives radiation from a radiation source SO. The source and the lithographic apparatus may be separate entities, for example, when the source is an excimer laser. In such cases, the source is not considered to form part of the lithographic apparatus and the radiation is passed from the source SO to the illuminator IL with the aid of a beam delivery system that, for example, includes suitable directing mirrors and/or a beam expander. In additional embodiments, the source may be an integral part of the lithographic apparatus, for example when the source is a mercury lamp. The source SO and the illuminator IL, together with the beam delivery system BD, if present, may be referred to as a "radiation system."

In an embodiment, the illuminator IL may comprise an adjuster configured to adjust the angular intensity distribution of the radiation beam. Generally, at least the outer and/or inner radial extent (commonly referred to as $\sigma_{outer}$ and $\sigma_{inner}$, respectively) of the intensity distribution in a pupil plane of the illuminator can be adjusted. In addition, the illuminator IL may include various other components, such as an integrator and a condenser. In such embodiments, the illuminator may be used to condition the radiation beam, to have a desired uniformity and intensity distribution in its cross-section.

The radiation beam B is incident on the patterning device (e.g., mask MA) that is held on the support (e.g., mask table MT) and is patterned by the patterning device. Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 (e.g., an interferometric device, linear encoder or capacitive sensor) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper, as opposed to a scanner, the mask table MT may be connected to a short-stroke actuator only, or may be fixed. Mask MA and substrate W may be aligned using mask alignment marks M1 and M2 and substrate alignment marks P1 and P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a further embodiment, lithographic apparatus 1 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

Figure 1B:
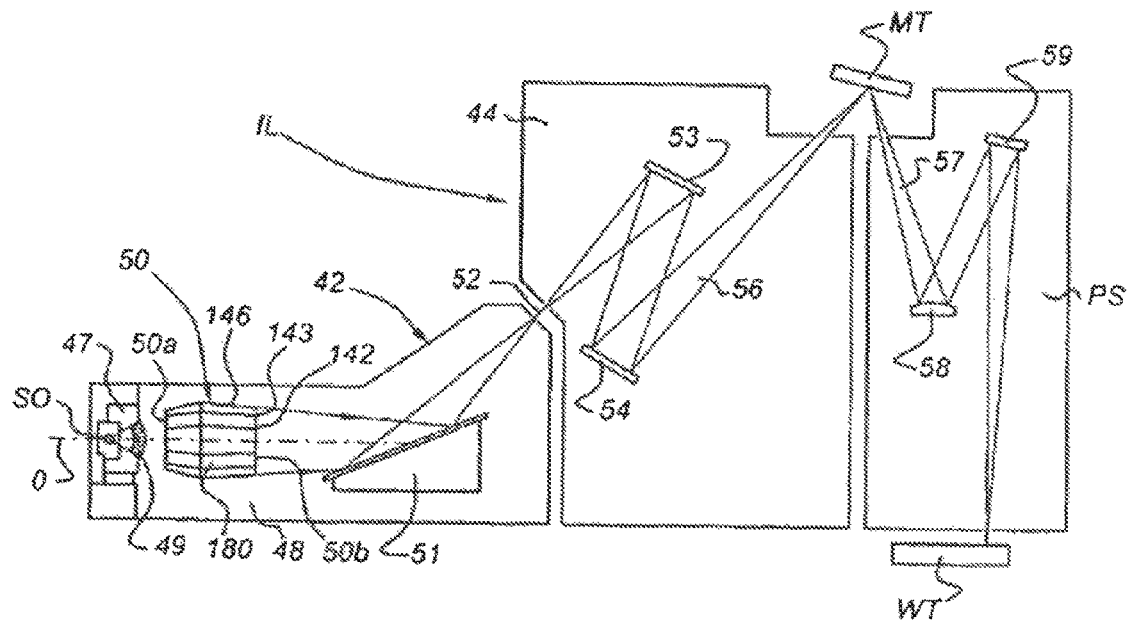

FIG. 1B schematically depicts an exemplary EUV lithographic apparatus according to an embodiment of the present invention. In FIG. 1B, a projection apparatus 1 includes a radiation system 42, an illumination optics unit 44, and a projection system PS. The radiation system 42 includes a radiation source SO, in which a beam of radiation may be formed by a discharge plasma. In an embodiment, EUV radiation may be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 positioned in or behind an opening in source chamber 47. In an embodiment, gas barrier 49 may include a channel structure.

Collector chamber 48 includes a radiation collector 50 (which may also be called collector mirror or collector) that may be formed from a grazing incidence collector. Radiation collector 50 has an upstream radiation collector side 50a and a downstream radiation collector side 50b, and radiation passed by collector 50 can be reflected off a grating spectral filter 51 to be focused at a virtual source point 52 at an aperture in the collector chamber 48. Radiation collectors 50 are known to skilled artisans.

From collector chamber 48, a beam of radiation 56 is reflected in illumination optics unit 44 via normal incidence reflectors 53 and 54 onto a reticle or mask (not shown) positioned on reticle or mask table MT. A patterned beam 57 is formed, which is imaged in projection system PS via reflective elements 58 and 59 onto a substrate (not shown) supported on wafer stage or substrate table WT. In various embodiments, illumination optics unit 44 and projection system PS may include more (or fewer) elements than depicted in FIG. 1B. For example, grating spectral filter 51 may optionally be present, depending upon the type of lithographic apparatus. Further, in an embodiment, illumination optics unit 44 and projection system PS may include more mirrors than those depicted in FIG. 1B. For example, projection system PS may incorporate one to four reflective elements in addition to reflective elements 58 and 59. In FIG. 1B, reference number 180 indicates a space between two reflectors, e.g., a space between reflectors 142 and 143.

In an embodiment, collector mirror 50 may also include a normal incidence collector in place of or in addition to a grazing incidence mirror. Further, collector mirror 50, although described in reference to a nested collector with reflectors 142, 143, and 146, is herein further used as example of a collector.

Further, instead of a grating 51, as schematically depicted in FIG. 1B, a transmissive optical filter may also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 1B, EUV transmissive optical filters may be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. In FIG. 1B, the beam of radiation B passes through lithographic apparatus 1. Following the light path that beam of radiation B traverses through lithographic apparatus 1, a first optical elements closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 1B (and additional optical elements not shown in the schematic drawing of this embodiment) may be vulnerable to deposition of contaminants produced by source SO, for example, Sn. Such may be the case for the radiation collector 50 and, if present, the spectral purity filter 51. Hence, a cleaning device may be employed to clean one or more of these optical elements, as well as a cleaning method may be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, may also be located along optical axis O. The radiation collector 50 may comprise reflectors 142, 143, and 146 (also known as a "shell" or a Wolter-type reflector including several Wolter-type reflectors). Reflectors 142, 143, and 146 may be nested and rotationally symmetric about optical axis O. In FIG. 1B, an inner reflector is indicated by reference number 142, an intermediate reflector is indicated by reference number 143, and an outer reflector is indicated by reference number 146. The radiation collector 50 encloses a certain volume, i.e., a volume within the outer reflector(s) 146. Usually, the volume within outer reflector(s) 146 is circumferentially closed, although small openings may be present.

Reflectors 142, 143, and 146 respectively may include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 may not be designed to reflect and collect EUV radiation. For example, at least part of the back side of the reflectors may not be designed to reflect and collect EUV radiation. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, and 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

In the embodiments described herein, the term "lens," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength $\lambda$ of 365, 248, 193, 157 or 126 nm) and extreme ultra-violet (EUV or soft X-ray) radiation (e.g., having a wavelength in the range of 5-20 nm, e.g., 13.5 nm), as well as particle beams, such as ion beams or electron beams. Generally, radiation of wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

Figure 2:
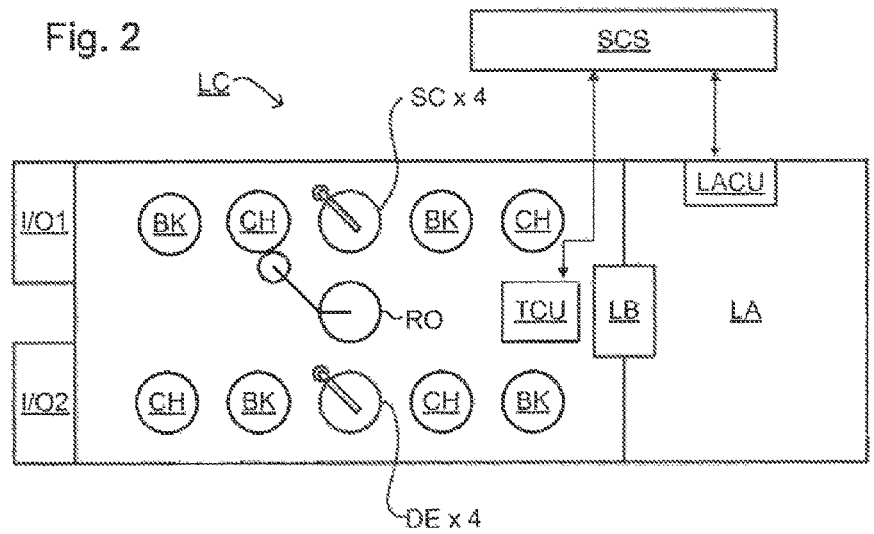

FIG. 2 schematically depicts a lithographic cell or cluster, according to an embodiment of the present invention. As shown in FIG. 2, a lithographic apparatus LA forms part of a lithographic cell LC, also referred to a lithocell or cluster, which also includes apparatus to perform pre- and post-exposure processes on a substrate. Lithographic cell LC includes spin coaters SC to deposit resist layers, developers DE to develop exposed resist, chill plates CH, and bake plates BK. A substrate handler, or robot, RO picks up substrates from input/output ports I/O1 and I/O2, moves them between the different process apparatus, and delivers then to the loading bay LB of the lithographic apparatus. These devices, which are often collectively referred to as the track, are under the control of a track control unit TCU, which is itself controlled by the supervisory control system SCS, which also controls the lithographic apparatus via lithography control unit LACU. As such, these different apparatus can be operated to maximize throughput and processing efficiency.

To ensure that substrates are exposed correctly and consistently, exposed substrates may be inspected to measure properties of the exposed substrates, including, but not limited to, overlay errors between subsequent layers, line thicknesses, and critical dimensions (CD). If such errors are detected, adjustments may be made during exposures of additional substrates, especially if the inspection process is timed such that other substrates of the same batch have not yet been exposed. Also, previously-exposed substrates may be stripped and reworked, thereby improving yield, or discarded, thereby avoiding performing exposures on substrates that are known to be faulty. In a case where only some target portions of a substrate are faulty, additional exposures can be performed on those target portions of the substrate that are free of errors.

In an embodiment, an inspection apparatus can be used to determine and measure the properties of the substrates, and in particular, how the properties of different substrates or different layers of the same substrate vary from layer to layer. The inspection apparatus may be integrated into the lithographic apparatus LA or the lithocell LC, or alternatively, the inspection apparatus may be a stand-alone device. To enable rapid measurements, it is desirable that the inspection apparatus measure properties in the exposed resist layer immediately after the exposure. However, the latent image in the resist has a very low contrast, as only a very small difference in refractive index exists between those parts of the resist that have been exposed to radiation and those that have not, and not all inspection apparatus have sufficient sensitivity to make useful measurements of the latent image. Therefore, measurements may be taken after the post-exposure bake step (PEB), which is customarily the first step carried out on exposed substrates and which increases the contrast between exposed and unexposed parts of the resist. At this stage, the image in the resist may be referred to as "semi-latent." In additional embodiments, measurements may be made of the developed resist image, at which point either the exposed or unexposed parts of the resist have been removed, or after a pattern transfer step, such as etching. In the latter embodiment, the possibilities for rework of faulty substrates are limited, but may nonetheless still provide useful information.

Figure 3:
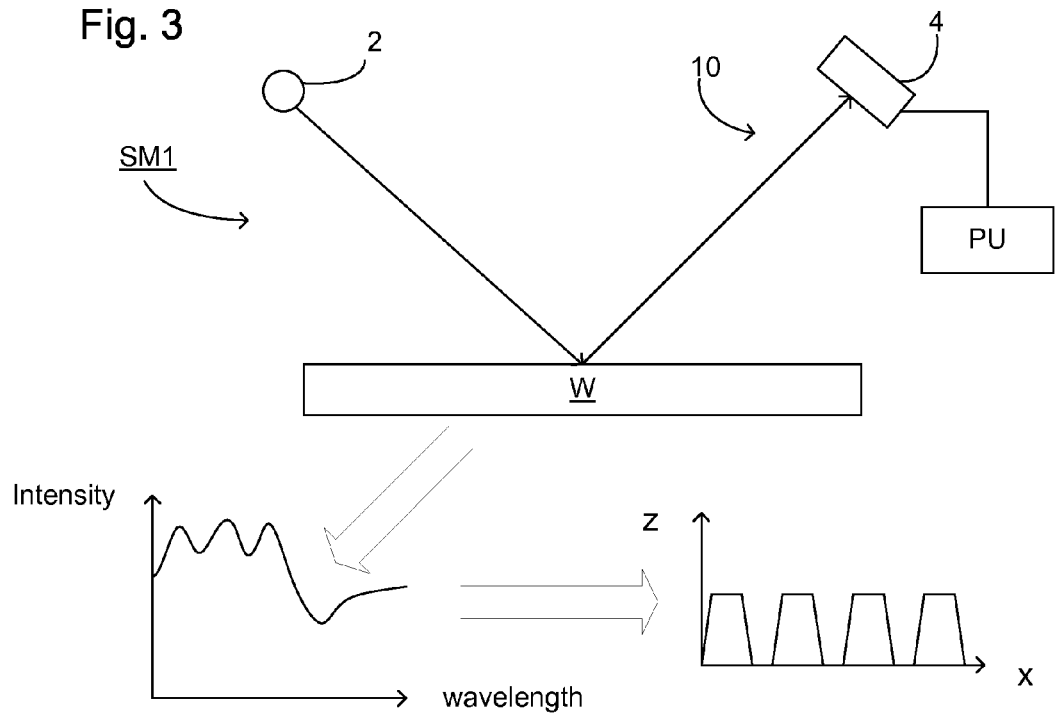
Figure 4:
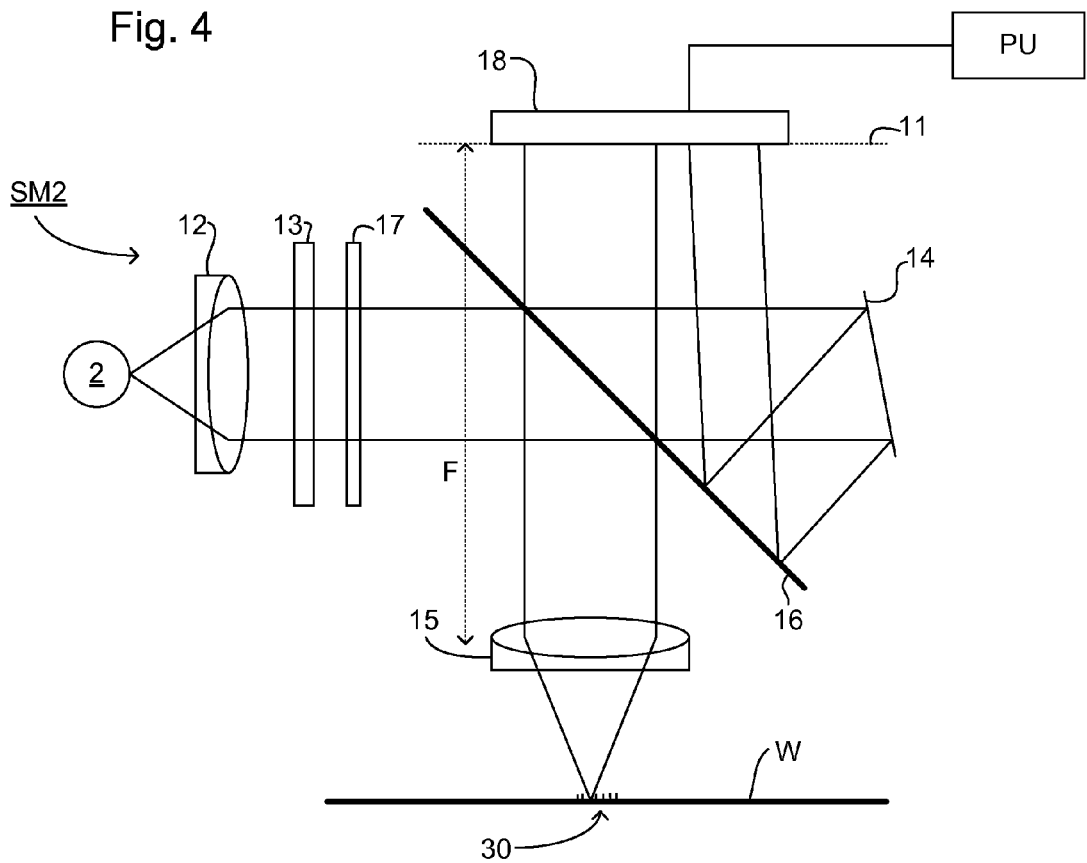

FIGS. 3 and 4 illustrate features of a scatterometer capable of inspecting and measuring properties of a substrate, according to embodiments of the present invention. In FIG. 3, a scatterometer SM1 includes a broadband (white light) radiation projector 2 that projects radiation onto a substrate W. The reflected radiation is passed to a spectrometer detector 4, which measures a spectrum 10 of the specular reflected radiation (e.g., intensity as a function of wavelength). From these measurements, the structure or profile giving rise to the detected spectrum may be reconstructed by a processing unit PU, e.g., by Rigorous Coupled Wave Analysis and non-linear regression, or by comparison with a library of simulated spectra, as shown at the bottom of FIG. 3. For the reconstruction, the general form of the structure is often known, and some parameters are assumed from knowledge of the process by which the structure was made, thereby leaving only a few parameters of the structure to be determined from the scatterometry data. In various embodiments, a scatterometer, such as that depicted in FIG. 3, may be configured as a normal-incidence scatterometer or an oblique-incidence scatterometer without departing from the spirit or scope of the present invention.

FIG. 4 schematically depicts a scatterometer SM2, according to an embodiment of the present invention. In FIG. 4, radiation emitted by a radiation source 2 is focused using a lens system 12 through an interference filter 13 and a polarizer 17 and is reflected by a partially-reflective surface 16. The reflected radiation is subsequently focused onto a substrate W via a microscope objective lens 15, which has a high numerical aperture (NA). In an embodiment, microscope objective lens 15 can have a numerical aperture of about 0.9, or alternatively, about 0.95. Further, immersion scatterometers can have lenses with numerical apertures greater than unity.

The reflected radiation is then transmitted through partially-reflective surface 16 onto a detector 18, which detects the scattered spectrum. In an embodiment, detector 18 may be located in a back-projected pupil plane 11, which is at a focal length of lens system 15, and the pupil plane may be re-imaged with auxiliary optics (not shown) onto detector 18. In such an embodiment, the pupil plane is the plane at which the radial position of radiation defines the angle of incidence and the angular position defines azimuth angle of the radiation. Further, in an embodiment, detector 18 can be a two-dimensional detector capable of measuring a two-dimensional angular scatter spectrum of a substrate target 30. For example, detector 18 may be an array of CCD or CMOS sensors, and detector 18 may use an integration time of about forty milliseconds per frame.

In the embodiment of FIG. 4, a reference beam may be used to measure the intensity of the incident radiation. For example, when the radiation beam is incident on beam splitter 16, a portion of the radiation beam is transmitted through the beam splitter as a reference beam towards a reference mirror 14. The reference beam is then projected onto a different part of detector 18.

In FIG. 4, interference filter 13 selects a wavelength of interest in a range of about 405 nm to about 790 nm, or alternatively, is a range between about 200 nm to about 300 nm. In an additional embodiment, interference filter 13 may be tunable, and further, a grating could replace interference filter 13 in scatterometer SM2 without departing from the spirit or scope of the invention.

Detector 18 may measure an intensity of scattered light at a single wavelength (or in a narrow wavelength range), may separately measure an intensity of multiple wavelengths of scattered light, or may measure an integrated intensity over a wavelength range. Further, detector 18 may separately measure an intensity of transverse magnetic-polarized light and transverse electric-polarized light, and/or a phase difference between the transverse magnetic-polarized light and transverse electric-polarized light.

In an embodiment, radiation source 2 of scatterometer SM2 can be a broadband light source (i.e., one with a wide range of light frequencies or wavelengths, and therefore of colors) that gives a large etendue and that allows for mixing of multiple wavelengths. In such an embodiment, each of the plurality of wavelengths in the broadband has a bandwidth of *8 and a spacing of at least 2*8 (i.e., twice the bandwidth).

Additionally, a scatterometer, such as scatterometer SM2 of FIG. 4, may include several "sources" of radiation (e.g., different portions of an extended radiation source that have been split using fiber bundles). In this way, angle-resolved scatter spectra can be measured at multiple wavelengths in parallel. Further, a 3-D spectrum (wavelength and two different angles) can be measured, which contains more information than a 2-D spectrum. Such a measurement allows more information to be measured, thereby increasing the robustness of the metrology process.

Target 30 on substrate W may be a grating, which is printed such that after development, the bars are formed of solid resist lines. Alternatively, the bars may be etched into the substrate. The pattern of bars is sensitive to chromatic aberrations in the lithographic projection apparatus, particularly projection system PL, and illumination symmetry, and the presence of such aberrations will manifest themselves in a variation in the printed grating. Accordingly, the scatterometry data of the printed gratings can be used to reconstruct the gratings. The parameters of the grating, such as line widths and shapes, may be input to the reconstruction process, which is performed by processing unit PU, from knowledge of the printing step and/or other scatterometry processes.

Figure 5:
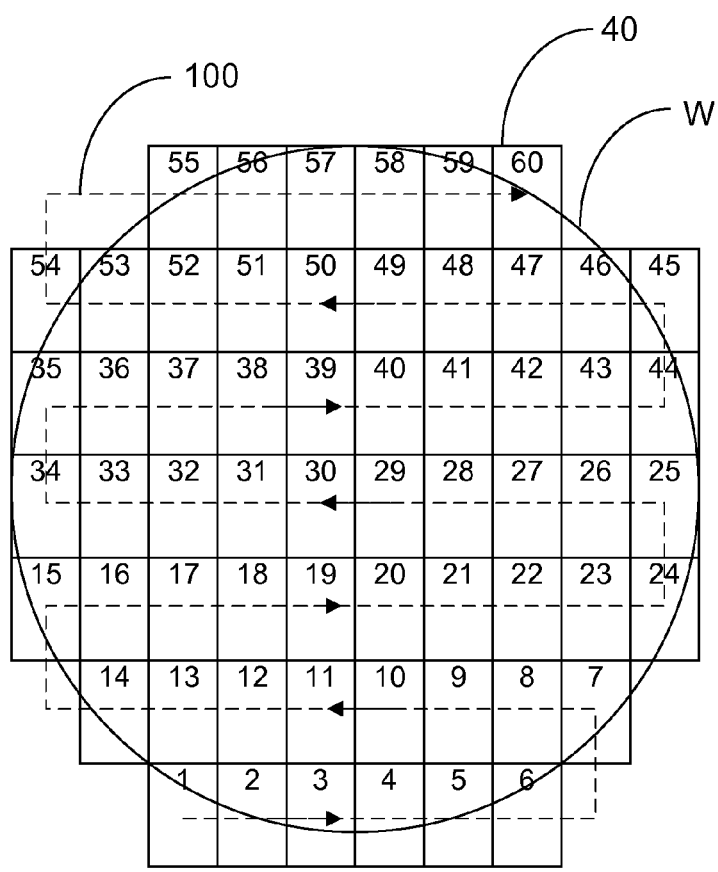

FIG. 5 schematically depicts a substrate W subdivided into multiple fields, according to an embodiment of the present invention. In FIG. 5, substrate W is divided into sixty fields, shown generally at 40. A lithographic apparatus, or alternatively, a scatterometer or other inspection apparatus, will expose and measure fields 40 of the substrate in discrete sections, or rasters, shown generally at 100. As the overlay can vary over the surface of the substrate, and even over the surface of a single field, the overlay must be determined for at least each field. However, as the overlay tends to vary according to a progression over the surface of the substrate, rather than suddenly from one field to the next, embodiments of the present invention determine the overlay for certain fields of the substrate and extrapolate the progression to other fields of the substrate.

As mentioned above, to ensure that a printed pattern is precisely superimposed for each successive layer, overlay errors are measured using overlay targets, and these targets are generally formed as gratings. Further, each field of the substrate, such as fields 40 of substrate W depicted in FIG. 5, includes one or more target gratings that facilitate the measurement of the overlay, and the number and orientation of target gratings within a respective field may depend on the accuracy at which a variation of overlay must be measured across the surface of the field.

Figure 7:
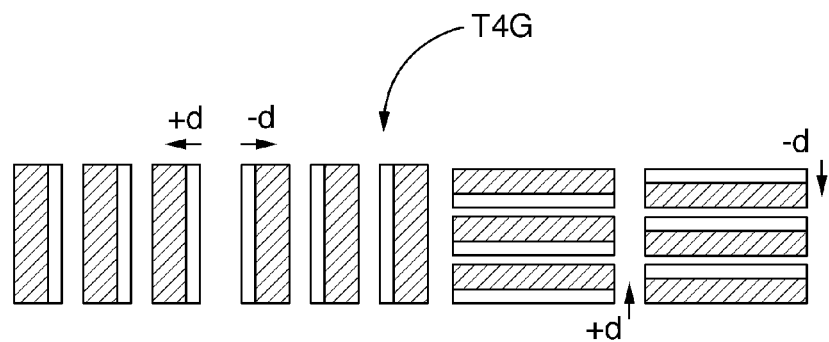
FIGS. 7 and 8 depicts exemplary targets, according to embodiments of the present invention.
Figure 8:
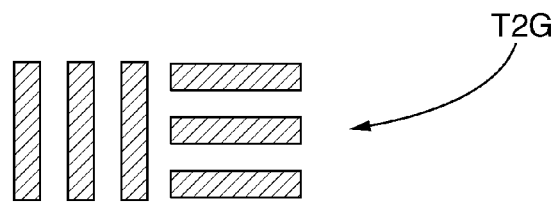

For example, each field in the substrate may have one target having four gratings (a 4G target or T4G) and multiple additional targets respectively having two gratings (a 2G target or T2G). In such an embodiment, a 4G target may include a first pair of gratings oriented in a first direction and a second pair of gratings oriented in a second direction parallel to or orthogonal to the first direction. For example, and as depicted in FIG. 7, the first pair of gratings can measure overlay in a x-direction and the second pair of gratings can measure overlay in a y-direction. Further, the 4G grating of FIG. 7 can also measure overlay in a rotational direction. Similarly, and as depicted in FIG. 8, a 2G target may include a first grating oriented in a first direction and a second grating oriented in a direction parallel to or orthogonal to the first direction. Additionally, both 4G and 2G overlay targets may include gratings oriented in one of the x- and y-directions to measure overlay only in that direction.

As depicted in FIG. 7, each pair of gratings in the 4G target includes a grating having a deliberate and predetermined offset, +d, and another grating that has a deliberate and predetermined offset, −d, of the same magnitude, but in the opposite direction. If there is an overlay error (OV), a resultant offset will be OV+d for one grating and OV−d for the other grating. The resulting, measured offset of each grating will therefore be different if there is an overlay error (OV). The difference in overlay error measured by a scatterometer, such as scatterometers SM1 and SM2 of FIGS. 3 and 4, between the two gratings is known as an asymmetry value (Asy). In general, two asymmetry values, $A_+$ and $A_-$, are obtained that correspond, respectively, to overlay values OV+d and OV−d.

Figure 10A:
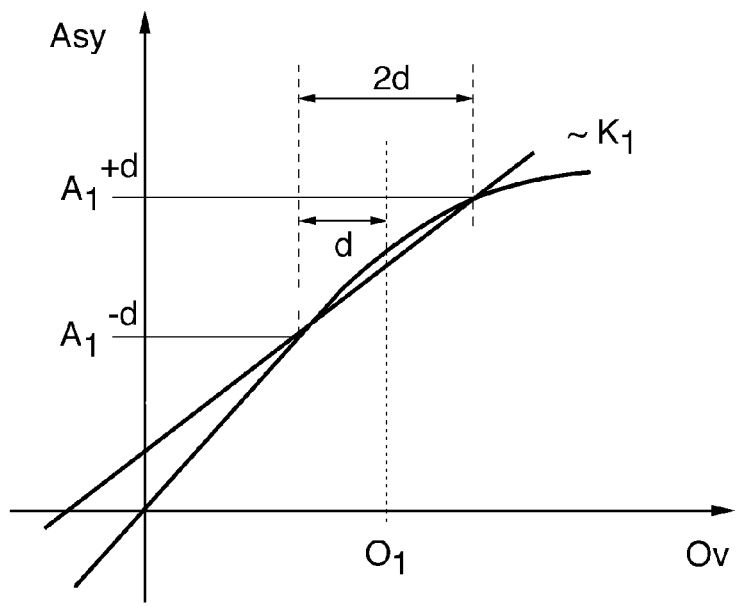
FIGS. 10A and 10B depict a linear relationship between asymmetry and overlay, according to an embodiment of the present invention.
Figure 10B:
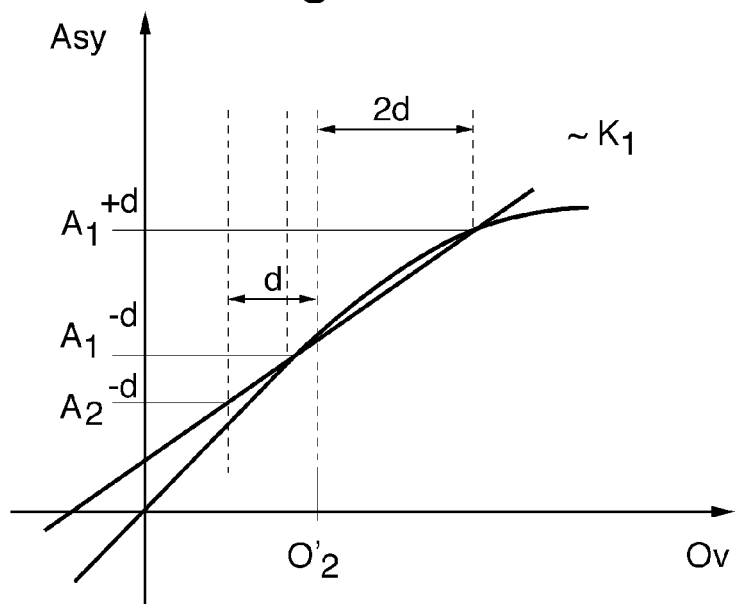
Figure 11:
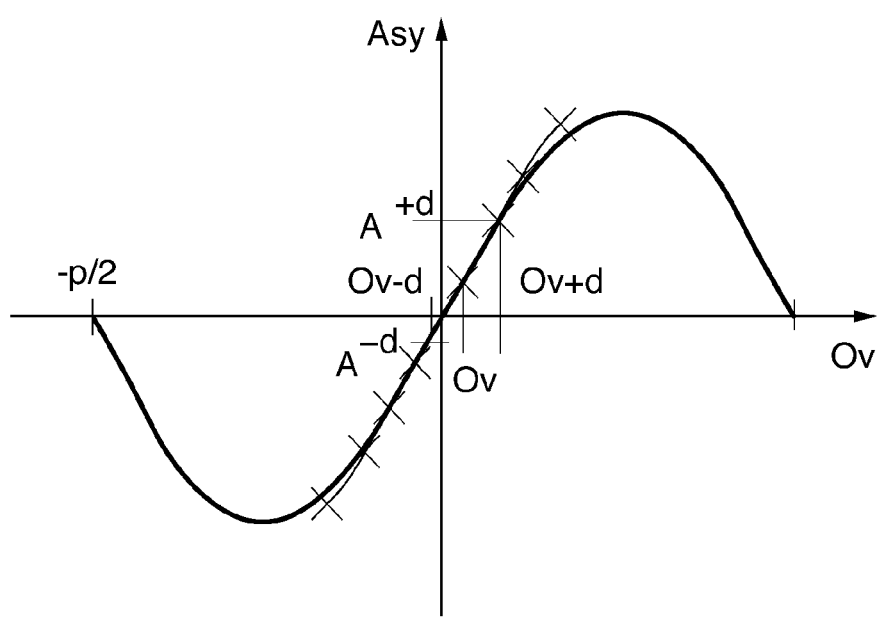
FIG. 11 depicts exemplary actual and the modeled relationships between asymmetry and overlay, according to an embodiment of the present invention.

A linear relationship can be assumed between asymmetry and overlay for each overlay target, as depicted in FIGS. 10A and 10B, in order to determine overlay from a measured asymmetry Asy and a known offset d. As shown in FIGS. 10A and 10B, as −d is the distance of one offset in one direction and +d is the distance of a neighboring offset in the opposite direction, the cumulative distance between neighboring gratings with opposite offsets is 2d. Assuming a linear relationship between the asymmetry values and an unknown overlay value, with $K_1$ as the gradient of the linear relationship, the corresponding overlay can be determined.

Figure 6C:
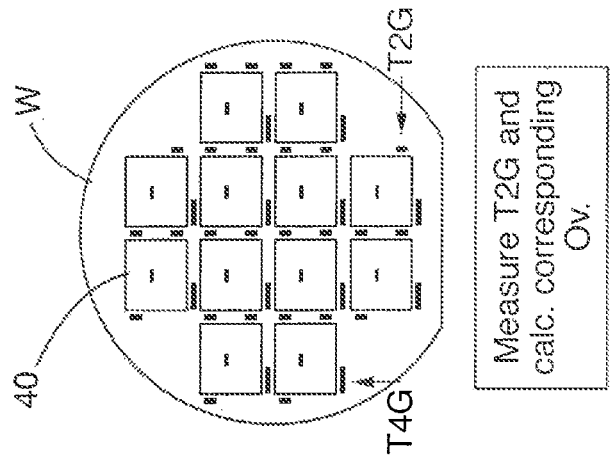
Figure 6B:
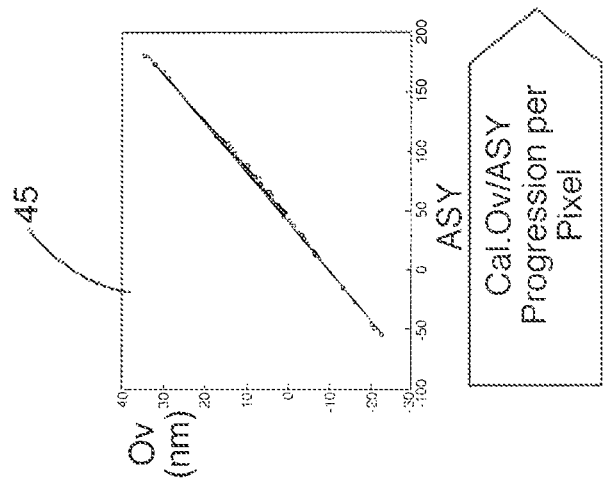
Figure 6A:
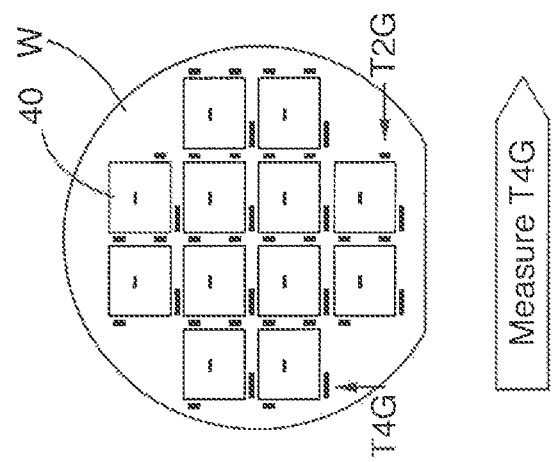

FIGS. 6A, 6B, and 6C illustrate features of an exemplary method for measuring a property of a substrate having a plurality of fields that include one or more target gratings, according to an embodiment of the present invention. In FIG. 6A, each field 40 of a substrate W includes one 4G target per field and one or more additional 2G targets per field. As described above, an exemplary 4G target is depicted in FIG. 7. In the embodiment of FIGS. 6A, 6B, and 6C, each 4G target is measured to obtain a corresponding overlay value, and an extrapolation is subsequently made to the corresponding 2G targets, which serves to verify the overlay value obtained from the 4G targets.

In FIG. 6A, an overlay for each 4G target (one for each field) is computed as described above, and as depicted in FIGS. 10A and 10B, a measured asymmetry Asy for each pair of gratings with +d and −d offsets is plotted as linear relationship with a slope of $K_1$ against the obtained overlay. The relationship between the measured asymmetry Asy and the predetermined offset is known and is calculated using the following equation:

$$OV = \frac{d}{2} \frac{A_+ + A_-}{A_+ - A_-},$$

where OV is overlay, d is offset, $A_+$ is asymmetry according to the grating offset in the +d direction, and $A_-$ is the asymmetry according to the grating offset in the −d direction. Therefore, using FIG. 10A and the equation above, an overlay error value OV is determined for a first 4G target. In an additional embodiment, a second overlay $OV_2$ of a second target with an asymmetry of $Asy_2$ can be determined from the same linear relationship, as depicted in FIG. 10B.

FIGS. 9A-9D depicts the asymmetry, the $1^{st}$ diffraction order, the $-1^{st}$ diffraction order, and the zeroth diffraction order for various overlay errors. As can be seen from FIG. 9D, the intensity of a zero order varies symmetrically as a function of the overlay. Therefore, if the zero order is detected, it is possible to identify a difference between two asymmetries that otherwise have the same value. For example, the two open circles depicted in FIG. 9A describe the asymmetry with zero overlay error, but a bias of about 15 nm. The solid dots on the same graph show the asymmetry when the overlay error is 70 nm and when the bias is fixed at 15 nm. However, the detected asymmetry in both these situations (i.e., the overlay error being 0 nm and 70 nm, respectively) would be the same.

Figure 9A:
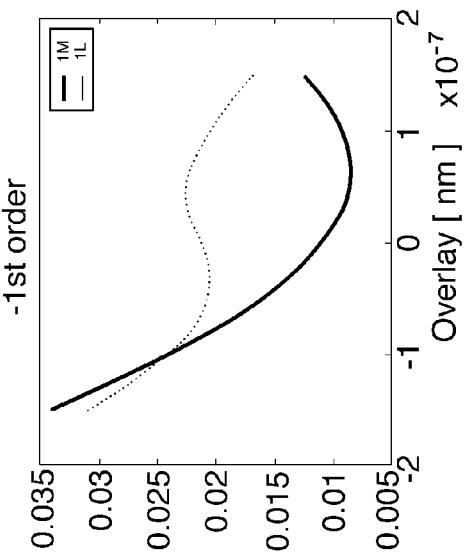
FIGS. 9A-9D illustrate a relationship between asymmetry and overlay, according to an embodiment of the present invention.
Figure 9B:
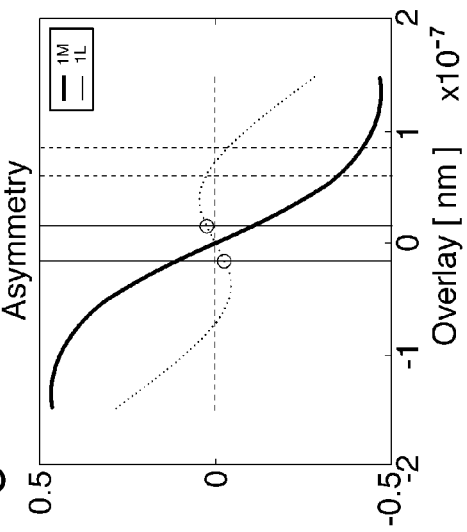
Figure 9D:
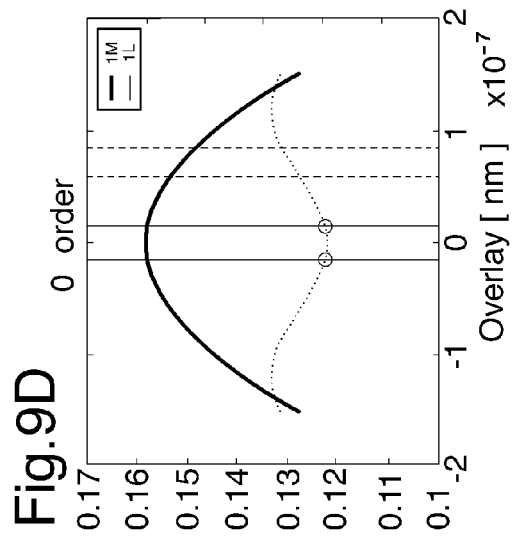
Figure 9C:
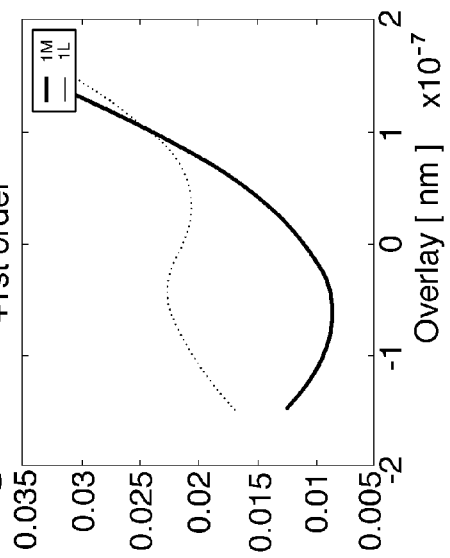

If the intensity of the zeroth order were detected, a different intensity between the overlay error of 0 nm and 70 nm would be detected. As shown in FIG. 9D, the detected intensity (shown by two solid dots) for an overlay error of 70 nm would be greater than the detected intensity (shown by open circles) with an overlay error of 0 nm. Thus, it is possible to differentiate between two different overlay values that result in the same asymmetry, and it is therefore possible to identify such false low overlay error calculations.

As an alternative to using the absolute value of the intensity of the zeroth order, large overlay errors may be identified using a difference between the intensities of the zeroth order for the gratings with a positive bias and the zeroth order for the gratings with a negative bias. If the overlay error were small, then the corresponding difference in intensities will be small due to the symmetric nature of the zeroth order (as shown in FIGS. 9A-9D).

Further, and as mentioned above, an apparatus, such as scatterometers SM1 and SM2 of FIGS. 3 and 4, measures the intensity of the $1^{st}$, $-1^{st}$ and zeroth diffraction order for two sets of overlapping gratings, e.g., the first set of gratings having a bias of +d and the second set of gratings having a bias of −d. Corresponding asymmetries $A_+$ and $A_-$ may be calculated as follows:

$$A_+ = \frac{I_1(OV+d) - I_{-1}(OV+d)}{I_1(OV+d) + I_{-1}(OV+d)} \text{ or } A_+ = I_1(OV+d) - I_{-1}(OV+d)$$

and $$A_- = \frac{I_1(OV-d) - I_{-1}(OV-d)}{I_1(OV-d) + I_{-1}(OV-d)} \text{ or } A_- = I_1(OV-d) - I_{-1}(OV-d),$$

in which $I_1$ is the intensity of the +1 order, $I_{-1}$ is the intensity of the −1 order, and OV is the overlay error.

A corresponding overlay may then be computed from the asymmetries as follows:

$$OV = \frac{d}{2} \frac{A_+ + A_-}{A_+ - A_-},$$

where $A_+$ and $A_-$ are the computed asymmetries and d is the predetermined offset, as described above.

In the embodiment of FIGS. 6A, 6B, and 6C, rather than trying to determine the variation in overlay over each field by having a plurality of 4G targets, only one 4G target per field is used and then a polynomial fit is computed between asymmetry and overlay over these first targets of all of the fields of the substrate. Such a calculation assumes that, if there were a variation in overlay from one field to the next, knowing how this variation in overlay affects asymmetry differences and how this extends to other fields facilitates an extrapolation of the overlay within each field using the polynomial relationship.

FIG. 6B illustrates the calculation of the progression or variance of asymmetry with respect to overlay over the substrate, and a variation of the relationship between overlay and asymmetry is depicted in FIG. 6B. As described above, a polynomial fit has been applied to the progression in FIG. 6B.

In various embodiments, the polynomial function may be a third-order polynomial function, or a higher-order polynomial function, including, but not limited to a fifth-order polynomial function, a seventh-order polynomial function, or an eleventh order polynomial function. Furthermore, the order of the polynomial function may also exceed eleventh-order without departing from the spirit or scope of the invention.

In FIG. 6C, asymmetry values are measured by for the smaller, more numerous 2G targets, such as those illustrated in FIG. 8. In the calculations of FIG. 6C, a different bias or offset may be used for the 2G targets than was used for the 4G targets, and additionally, no bias may be used (as shown in FIG. 8).

In an embodiment, a single grating may be used within the subsequently-measured 2G gratings to measure asymmetry and overlay in a single one direction. Once such asymmetry values are known, the determined polynomial function can be applied to the smaller, more numerous 2G targets that are associated with each field 40 on the substrate W. The overlay of the 2G targets is determined, thus giving rise to an overall measurement of overlay for the whole substrate, as depicted in FIG. 6C.

The methods described above in reference to FIGS. 6A, 6B, and 6C possesses advantages over existing techniques for computing overlay for a substrate having multiple fields. For example, the methods described above require fewer overlay targets than existing solutions, thereby overcoming the excessive use of scribe lane space characteristic of these conventional techniques. Further, for example, methods described above reduce the space requirements for 2(n−1) gratings per field (where n is the number of 4G targets required using existing techniques, and n−1 is the number of 2G targets usable in the present embodiment) and also reduce the time for the corresponding measurements and calculations relative to existing techniques.

The embodiments described above assume the polynomial fit for the relationship between asymmetry and overlay applies across the whole substrate. However, occasionally, a polynomial function will not fit across the targets of a substrate W. In such a case, the 4G targets on a plurality of substrates of a batch (or lot) can be measured, and a polynomial fit can be determined over the plurality of substrates for each respective field. In contrast to the embodiments of FIGS. 6A-6C, which determine how the overlay varies across the substrate in a scan direction, determining the polynomial fit over the plurality of substrates for each respective field determines how the overlay varies over time.

In order to obtain the asymmetry values described above, a detector may detect an image of an overlay target in a pupil plane of an optical system that transmits radiation between a radiation source, the target and the detector. When the detector is measuring the image in the pupil plane, the parameter that is actually measured is an intensity of the reflected radiation in each of a multiplicity of pixels of the image. As there may be several pixels per target, the asymmetry value is therefore actually an intensity value of each pixel for the various diffraction orders of the reflected radiation beam. The grating of the target serves to diffract the radiation beam, thus giving rise to the different diffraction orders. Ideally, the asymmetry value is obtained for each pixel of the pupil plane, and a polynomial fit is determined for each pixel. An overlay value is subsequently determined for each pixel for each target grating. As mentioned above, a single grating may give rise to a plurality of pixels, and in an embodiment, an average over the pixels may then be taken. Further, an average of the asymmetry values of each pixel may be taken to give rise to only a single polynomial function.

Similar to the methods described above in reference to FIGS. 6A, 6B, and 6C, the polynomial fit determined from the relationship between asymmetry and overlay is then used to determine the overlay of two-grating (2G) targets on the substrate. In an embodiment, the determination of the overlay of 2G targets is also done on a pixel-by-pixel basis.

In an additional embodiment, the methods described above in reference to FIGS. 6A, 6B, and 6C are adaptive and self-learning. For example, the accuracy of the polynomial fit increases as a larger the number of substrates are measured. Further, to overcome inaccuracies in the overlay/asymmetry progression because of a process-induced wafer stack variation (e.g., variations in layers in product build-up), polynomial fits can be calculated per field over several lots (or batches). One advantage of such a procedure is that target throughput is increased, up to a factor of two, as the number of measurements is reduced, assuming the fit is well known. As such, very few 4G targets need to be measured because a self-learning "smart" system can verify only the validity of the polynomial fit once per substrate. If a fit corresponding to one or more previous substrates is consistent with measurements made on a present substrate, only the 2G targets need to be measured on the present substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. An apparatus for measuring properties of a substrate, comprising:
   a radiation source configured to direct radiation onto targets of corresponding fields of the substrate, wherein a first one of the targets has at least:
      a first grating and a second grating having respective predetermined offsets, the predetermined offset of the first grating being in a direction opposite the predetermined offset of the second grating, and
      a third grating and a fourth having respective predetermined offsets, the predetermined offset of the third grating being in a direction opposite the predetermined offset of the fourth grating;
   a detector configured to detect the radiation reflected from the first one of the targets and to obtain an asymmetry value for the first one of the targets from the detected radiation; and
   a controller configured to (i) determine an overlay value for the first one of the targets based on at least the obtained asymmetry value and the predetermined offsets and (ii) determine a polynomial fit across the remaining targets of a corresponding field based on a relationship between the obtained asymmetry value and the determined overlay value of the remaining targets.

2. The apparatus of claim 1, wherein the first and second grating form a first pair of gratings oriented in a first direction and the third and fourth grating form a second pair of gratings oriented in a second direction, the second direction being different from the first direction.

3. The apparatus of claim 2, wherein the second direction is orthogonal to the first direction.

4. The apparatus of claim 1, wherein:
   the radiation source is configured to direct radiation onto a second one of the targets in each of the corresponding fields;
   the detector is configured to detect the radiation reflected from each of the second one of the targets to obtain a second asymmetry value for each of the second one of the targets from the detected radiation; and
   the controller is configured to apply the determined polynomial fit to the second asymmetry value obtained for each of the second one of the targets in order to determine an overlay value of each of the second one of the targets.

5. The apparatus of claim 1, wherein the controller is configured to determine the overlay value for each of the first one of the targets by assuming a linear relationship between the asymmetry value and an overlay value for each of the first one of the targets.

6. The apparatus of claim 1, wherein the controller is configured to determine a second polynomial fit for the relationship between the asymmetry values and the overlay values of the first one of the targets in the fields from a plurality of substrates.

7. The apparatus of claim 1, wherein:
the detector is positioned along a pupil plane of an optical path of the radiation source, the substrate, and the detector;
the detector is configured to obtain a second asymmetry value for each pixel of a detected image of the pupil plane;
the controller is configured to obtain an average asymmetry value of the obtained second asymmetry values for a plurality of pixels; and
the controller is configured to determine a second polynomial fit for the average asymmetry value against an overlay value for each first one of the targets.

8. The apparatus of claim 1, wherein the polynomial fit is at least a third-order polynomial function.

9. The apparatus of claim 1, wherein the polynomial fit is a fifth-order polynomial function or a seventh-order order polynomial function.

10. The apparatus according of claim 1, wherein the detector is configured to obtain the asymmetry value by calculating a difference between a positive and a negative diffraction order of the reflected radiation beam.

11. The apparatus of claim 1, wherein:
the controller is configured to test an accuracy of a previously-determined polynomial fit with respect to the polynomial fit determined for the first one of the targets of the substrate; and
the controller is configured to selectively apply the previously-determined polynomial fit to one or more fields of the present substrate based on the tested accuracy.

12. A substrate, comprising:
at least two targets associated with each field of the substrate, wherein only one target of the at least two targets comprises:
a first grating and a second grating having respective predetermined offsets, the predetermined offset of the first grating being in a direction opposite the predetermined offset of the second grating, and
a third gating, and a fourth grating having respective predetermined offsets, the predetermined offsets of the third grating being in a direction opposite the predetermined offset of the fourth grating; and
wherein the remaining target or targets of the at least two targets each comprise a first grating and a second grating.

13. The substrate of claim 12, wherein:
the first and second grating of the only one target form a first pair of gratings oriented in a first direction and the third and fourth grating of the only one target form a second pair of gratings oriented in a second direction, the second direction being different from the first direction; and
the first and second grating of each of the remaining target or targets form a pair of gratings oriented in the first direction.

14. A method of measuring properties of a substrate, comprising:
printing targets onto corresponding fields of the substrate, wherein a first one of the targets has at least a first grating and a second grating having respective predetermined offsets, the predetermined offset of the first grating being in a direction opposite the predetermined offset of the second grating and having a third gating and a fourth grating having respective predetermined offsets, the predetermined offset of the third grating being in a direction opposite the predetermined offset of the fourth grating;
reflecting a radiation beam from the first one of the targets of corresponding fields of the substrate;
detecting the reflected radiation beam from the first one of the targets to obtain an asymmetry value for the first one of the targets;
determining an overlay value for the first one of the targets based on at least the obtained asymmetry value and the predetermined offsets; and
determining a polynomial fit across the remaining targets of a corresponding field based on the relationship between the obtained asymmetry value and the determined overlay value of the remaining targets.

15. The method of claim 14, further comprising:
reflecting a radiation beam from a second one of the targets in each of the corresponding fields of the substrate;
detecting the reflected radiation beam from each of the second one of the targets to obtain a second asymmetry value for each of the second one of the targets; and
applying the determined polynomial fit to the second asymmetry value obtained for each of the second one of the targets to determine an overlay value of each of the second one of the targets.

16. The method of claim 15, wherein:
the first and second grating form a first pair of gratings oriented in a first direction and the third and fourth grating form a second pair of gratings oriented in a second direction, the second direction being different from the first direction; and
a second one of the targets further comprises a first grating and a second grating, the first and second grating of the second one of the targets forming a pair of gratings oriented in the first direction.

17. A lithographic apparatus, comprising:
an illumination optical system configured to illuminate a pattern on a patterning device;
a projection optical system configured to project an image of the pattern onto a substrate having multiple measurement fields; and
an apparatus for measuring properties of a substrate, comprising:
a radiation source configured to direct radiation onto targets of corresponding fields of the substrate, wherein a first one of the targets has at least a first grating and a second grating having respective predetermined offsets, the predetermined offset of the first grating being in a direction opposite the predetermined offset of the second grating, and a third grating and a fourth grating having respective predetermined offsets, the predetermined offset of the third grating being in a direction opposite the predetermined offset of the fourth grating;
a detector configured to detect the radiation reflected from the first one of the targets and to obtain an asymmetry value for the first one of the targets from the detected radiation; and
a controller configured to (i) determine an overlay value for the first one of the targets based on at least the obtained asymmetry value and the predetermined offsets and (ii) determine a polynomial fit across the remaining targets of a corresponding field based on a relationship between the obtained asymmetry value and the determined overlay value of the remaining targets.

18. The lithographic apparatus of claim 17, wherein:

the radiation source is configured to direct radiation onto a second one of the targets in each of the corresponding fields;

the detector is configured to detect the radiation reflected from each of the second one of the targets to obtain a second asymmetry value for each of the second one of the targets from the detected radiation; and the controller is configured to apply the determined polynomial fit to the second asymmetry value obtained for each of the second one of the targets in order to determine an overlay value of each of the second one of the targets.

19. A lithographic cell, comprising:

a coater arranged to coat a substrate with a radiation sensitive layer;

a lithographic apparatus arranged to expose images onto the radiation sensitive layer of the substrate coated by the coater;

a developer arranged to develop images exposed by the lithographic apparatus; and an apparatus for measuring properties of a substrate, comprising:

a radiation source configured to direct radiation onto targets of corresponding fields of the substrate, wherein a first one of the targets has at least a first grating and a second grating having respective predetermined offsets, the predetermined offset of the first grating being in a direction opposite the predetermined offset of the second grating, and a third grating and a fourth grating having respective predetermined offsets, the predetermined offset of the third grating being in a direction opposite the predetermined offset of the fourth grating;

a detector configured to detect the radiation reflected from the first one of the targets and to obtain an asymmetry value for the first one of the targets from the detected radiation; and a controller configured to (i) determine an overlay value for the first one of the targets based on at least the obtained asymmetry value and the predetermined offsets and (ii) determine a polynomial fit across the remaining targets of a corresponding field based on a relationship between the obtained asymmetry value and the determined overlay value of the remaining targets.

20. The lithographic cell of claim 19, wherein:

the radiation source is configured to direct radiation onto a second one of the targets in each of the corresponding fields;

the detector is configured to detect the radiation reflected from each of the second one of the targets to obtain a second asymmetry value for each of the second one of the targets from the detected radiation; and the controller is configured to apply the determined polynomial fit to the second asymmetry value obtained for each of the second one of the targets in order to determine an overlay value of each of the second one of the targets.

21. A device manufacturing method, comprising:

forming a pattern on a substrate; and determining a value related to a parameter of the formed pattern, comprising:

printing targets onto corresponding fields of the substrate, wherein:

a first one of the targets has at least a first grating and a second grating having respective predetermined offsets, the predetermined offset of the first grating being in a direction opposite the predetermined offset of the second grating, and a third grating and a fourth gating having respective predetermined offsets, the predetermined offset of the third grating being in a direction opposite the predetermined offset of the fourth grating reflecting a radiation beam from the first one of the targets of corresponding fields of the substrate;

detecting the reflected radiation beam from the first one of the targets to obtain an asymmetry value for the first one of the targets;

determining an overlay value for the first one of the targets based on at least the obtained asymmetry value and the predetermined offsets;

determining a polynomial fit across the remaining targets of a corresponding field based on the relationship between the obtained asymmetry value and the determined overlay value of the remaining targets.

22. The method of claim 21, wherein determining a value related to a parameter of the formed pattern further comprises:

reflecting a radiation beam from a second one of the targets in each of the corresponding fields of the substrate;

detecting the reflected radiation beam from each of the second one of the targets to obtain a second asymmetry value for each of the second one of the targets; and applying the determined polynomial fit to the second asymmetry value obtained for each of the second one of the targets to determine an overlay value of each of the second one of the targets.

* * * * *

UNITED STATES PATENT AND TRADEMARK OFFICE
CERTIFICATE OF CORRECTION

PATENT NO.         : 8,665,417 B2                                    Page 1 of 1
APPLICATION NO.    : 12/996211
DATED              : March 4, 2014
INVENTOR(S)        : Fuchs et al.

It is certified that error appears in the above-identified patent and that said Letters Patent is hereby corrected as shown below:

In the Claims:

Col. 18, line 26, after "fourth", please delete "gating" and insert --grating--
Col. 19, line 42, after "third", please delete "gating" and insert --grating--
Col. 19, line 43, after "predetermined", please delete "offsets" and insert --offset--
Col. 19, line 66, after "third", please delete "gating" and insert --grating--
Col. 22, line 21, after "fourth", please delete "gating" and insert --grating--

Signed and Sealed this
Fifth Day of August, 2014

Michelle K. Lee
*Deputy Director of the United States Patent and Trademark Office*